(12) United States Patent
Hirler et al.

(10) Patent No.: US 9,530,847 B2
(45) Date of Patent: Dec. 27, 2016

(54) SEMICONDUCTOR DEVICE WITH FIELD ELECTRODE AND FIELD DIELECTRIC

(71) Applicant: Infineon Technologies Austria AG, Villach (AT)

(72) Inventors: Franz Hirler, Isen (DE); Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/799,095

(22) Filed: Jul. 14, 2015

(65) Prior Publication Data

US 2016/0020287 A1  Jan. 21, 2016

(30) Foreign Application Priority Data

Jul. 15, 2014 (DE) .......................... 10 2014 109 924

(51) Int. Cl.
| | |
|---|---|
| *H01L 29/423* | (2006.01) |
| *H01L 29/40* | (2006.01) |
| *H01L 29/739* | (2006.01) |
| *H01L 21/28* | (2006.01) |
| *H01L 29/06* | (2006.01) |
| *H01L 29/78* | (2006.01) |
| *H01L 29/51* | (2006.01) |

(52) U.S. Cl.
CPC ....... *H01L 29/407* (2013.01); *H01L 21/28008* (2013.01); *H01L 29/0696* (2013.01); *H01L 29/423* (2013.01); *H01L 29/4236* (2013.01); *H01L 29/513* (2013.01); *H01L 29/739* (2013.01); *H01L 29/7802* (2013.01); *H01L 29/7813* (2013.01); *H01L 29/7827* (2013.01)

(58) Field of Classification Search
CPC .. H01L 29/0696; H01L 29/407; H01L 29/423; H01L 29/4236; H01L 29/739; H01L 29/7827

See application file for complete search history.

(56) References Cited

U.S. PATENT DOCUMENTS

| | | | | |
|---|---|---|---|---|
| 4,541,001 | A | * | 9/1985 | Schutten ............... H01L 21/761 257/331 |
| 8,247,865 | B2 | | 8/2012 | Hirler |
| 8,748,976 | B1 | * | 6/2014 | Kocon ................. H01L 29/404 257/330 |

(Continued)

OTHER PUBLICATIONS

Virginia Semiconductor "The General Properties of Si, Ge, SiGe, SiO2 and Si3N4" Jun. 2002, 5 pages.*

*Primary Examiner* — Allan R Wilson
(74) *Attorney, Agent, or Firm* — Eschweiler & Associates, LLC

(57) ABSTRACT

A semiconductor device includes a field electrode structure that includes a field electrode and a field dielectric surrounding the field electrode. The field dielectric includes a first dielectric layer and a second dielectric layer having a smaller band gap and/or a lower conduction band edge than the first dielectric layer. A semiconductor body includes a transistor section that surrounds the field electrode structure and directly adjoins the first dielectric layer. The transistor section includes a source zone, a first drift zone section and a body zone separating the source zone and the first drift zone section. The body zone forms a first pn junction with the source zone and a second pn junction with the first drift zone section.

16 Claims, 10 Drawing Sheets

(56) References Cited

U.S. PATENT DOCUMENTS

| | | | | |
|---|---|---|---|---|
| 2007/0069257 A1* | 3/2007 | Mauder | ............... | H01L 29/407 |
| | | | | 257/288 |
| 2007/0181975 A1* | 8/2007 | Koops | ............... | H01L 29/407 |
| | | | | 257/559 |
| 2009/0152624 A1* | 6/2009 | Hiller | ............... | H01L 29/0615 |
| | | | | 257/330 |
| 2011/0233655 A1* | 9/2011 | Shimizu | ............... | B82Y 10/00 |
| | | | | 257/325 |
| 2012/0061753 A1* | 3/2012 | Nishiwaki | ............... | H01L 29/407 |
| | | | | 257/331 |
| 2013/0221436 A1* | 8/2013 | Hossain | ............... | H01L 29/407 |
| | | | | 257/334 |
| 2014/0209999 A1* | 7/2014 | Sato | ............... | H01L 29/7813 |
| | | | | 257/330 |

\* cited by examiner

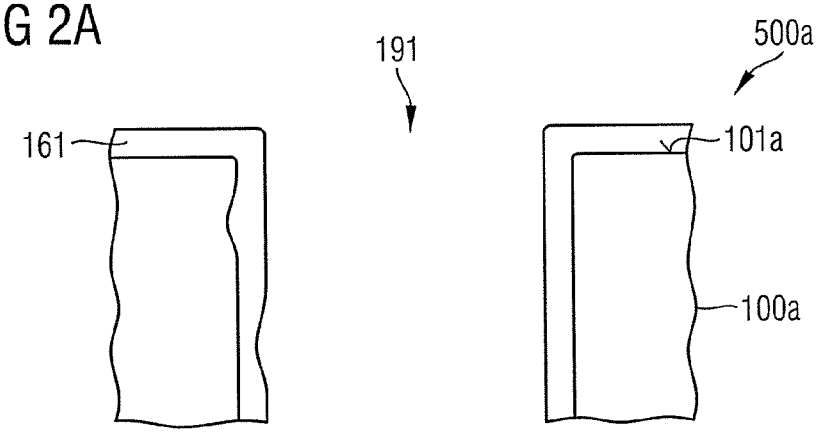
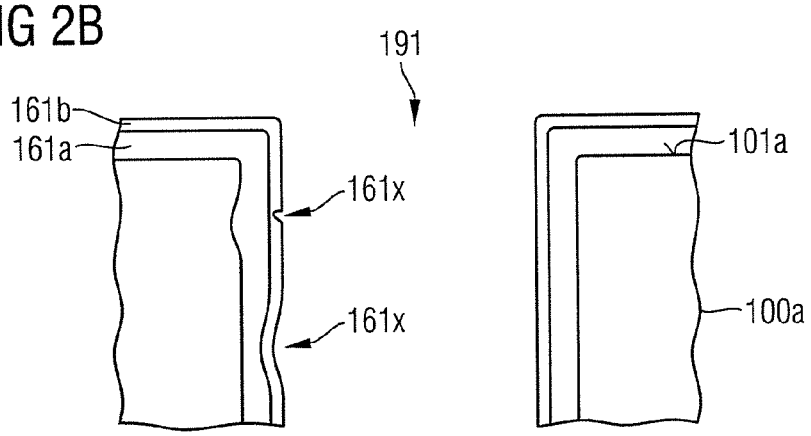
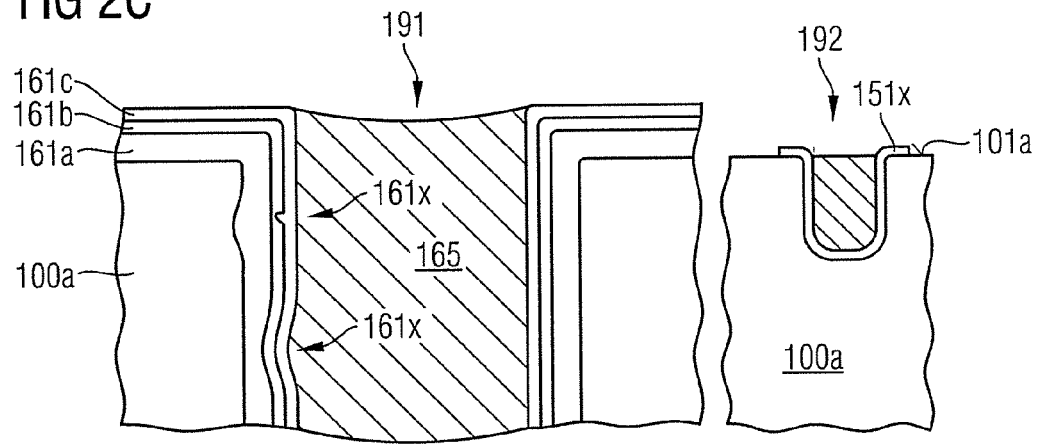

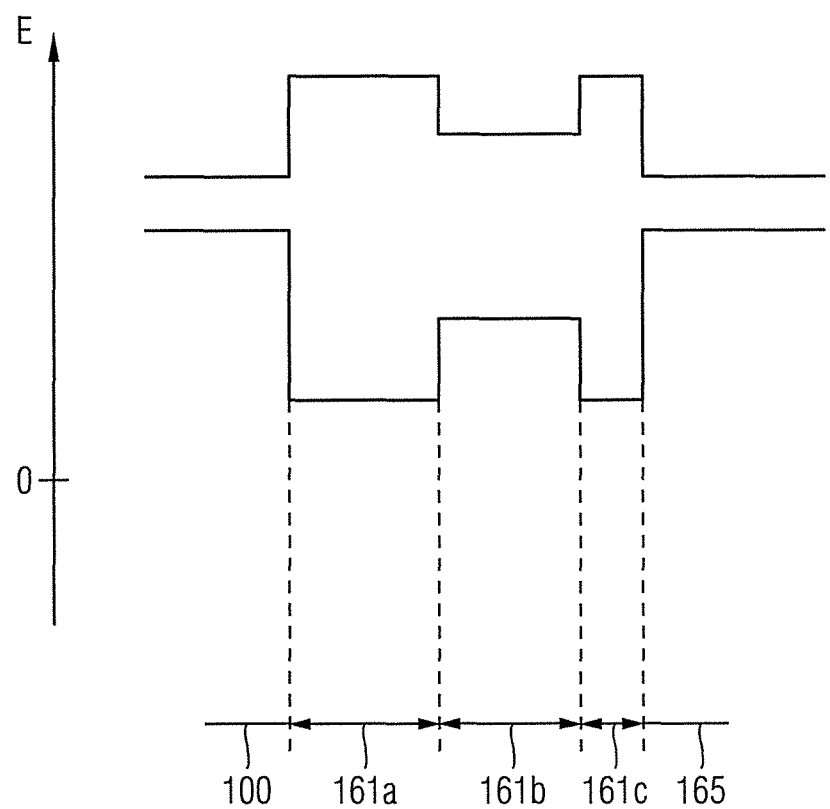

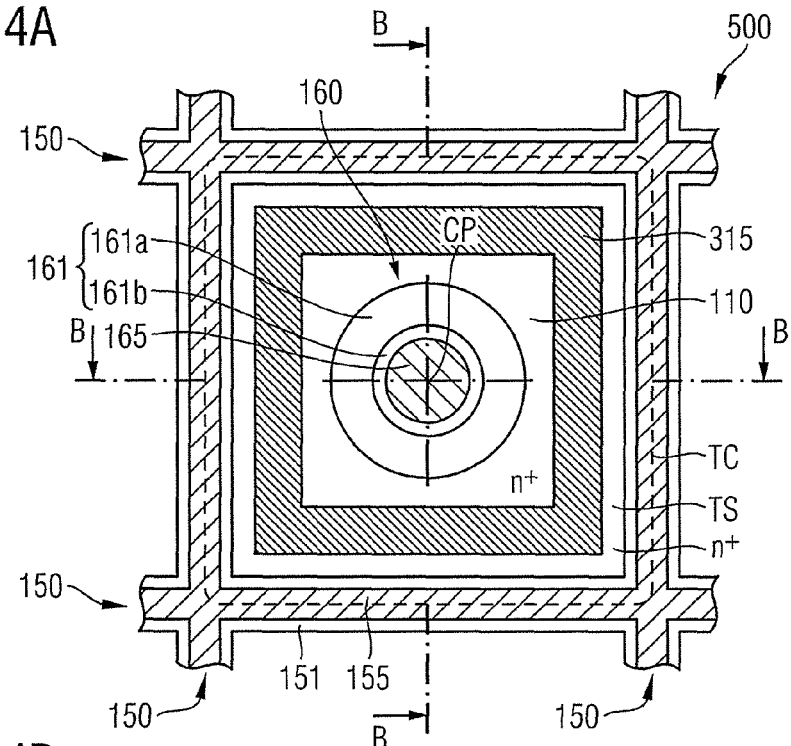
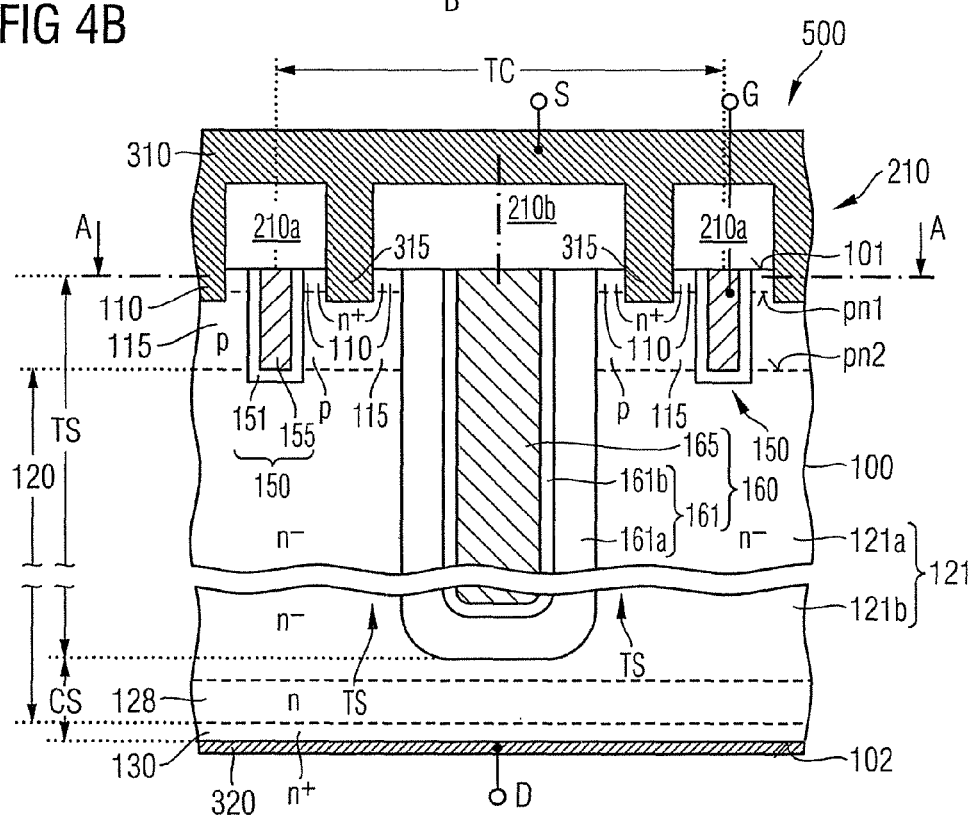

SEMICONDUCTOR DEVICE WITH FIELD ELECTRODE AND FIELD DIELECTRIC

CROSS REFERENCE TO RELATED APPLICATIONS

This application claims priority to German Application number 10201409924.9, filed on Jul. 15, 2014, the contents of which are herein incorporated by reference in its entirety.

BACKGROUND

Power semiconductor devices such as IGFETs (insulated gate field effect transistors) and IGBTs (insulated gate bipolar transistors) are typically vertical devices with a load current flow between a first surface at a front side of a semiconductor die and a second surface at a rear side. In a blocking mode, stripe-shaped compensation structures extending from the front side into the semiconductor die deplete a drift zone in the semiconductor die. The compensation structures allow higher dopant concentrations in the drift zone without adverse impact on the blocking capabilities. Higher dopant concentrations in turn reduce the on state resistance of the device.

It is desirable to provide reliable semiconductor devices with low ohmic losses.

SUMMARY

According to an embodiment a semiconductor device includes a field electrode structure including a field electrode and a field dielectric surrounding the field electrode. The field dielectric includes a first dielectric layer and a second dielectric layer having at least one of a smaller band gap and a lower conduction band edge than the first dielectric layer. A transistor section of a semiconductor body surrounds the field electrode structure, directly adjoins the first dielectric layer, and includes a source zone, a first drift zone section and a body zone separating the source zone and the first drift zone section. The body zone forms a first pn junction with the source zone and a second pn junction with the first drift zone section.

According to another embodiment a method of manufacturing a semiconductor device includes forming first trenches that extend from a main surface into a semiconductor layer of a semiconductor substrate. A first horizontal extension of the first trenches parallel to the main surface of the semiconductor substrate is at most twice as large as a second horizontal extension orthogonal to the first horizontal extension. A first dielectric layer is formed that lines the first trenches. A second dielectric is formed on the first dielectric layer. Field electrodes are formed in the first trenches and gate electrodes are formed in second trenches.

According to an embodiment an electronic assembly includes a semiconductor device that includes a field electrode structure with a field electrode and a field dielectric surrounding the field electrode. The field dielectric includes a first dielectric layer and a second dielectric layer having at least one of a smaller band gap and a lower conduction band edge than the first dielectric layer. A transistor section of a semiconductor body surrounds the field electrode structure, directly adjoins the first dielectric layer, and includes a source zone, a first drift zone section and a body zone separating the source zone and the first drift zone section. The body zone forms a first pn junction with the source zone and a second pn junction with the first drift zone section.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments of the disclosure and intended advantages will be readily appreciated as they become better understood by reference to the following detailed description.

FIG. 2A is a schematic cross-sectional view of a portion of a semiconductor substrate for illustrating a method of manufacturing a semiconductor device according to an embodiment, after forming a first dielectric layer.

FIG. 2B is the semiconductor substrate portion of FIG. 2A after forming a second dielectric layer.

FIG. 2C is a schematic cross-sectional view of the semiconductor substrate portion of FIG. 2B after forming a third dielectric layer and a field electrode material.

FIG. 3 schematically illustrates an electronic band structure of a semiconductor device according to an embodiment for illustrating effects of the embodiments.

FIG. 4A is a schematic horizontal cross-sectional view of a portion of a semiconductor device according to an embodiment with a two-layer field dielectric.

FIG. 4B is a schematic vertical cross-sectional view of the semiconductor device portion of FIG. 4A.

DETAILED DESCRIPTION

In the following detailed description, reference is made to the accompanying drawings, which form a part hereof and in which are shown by way of illustrations specific embodiments in which the disclosure may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
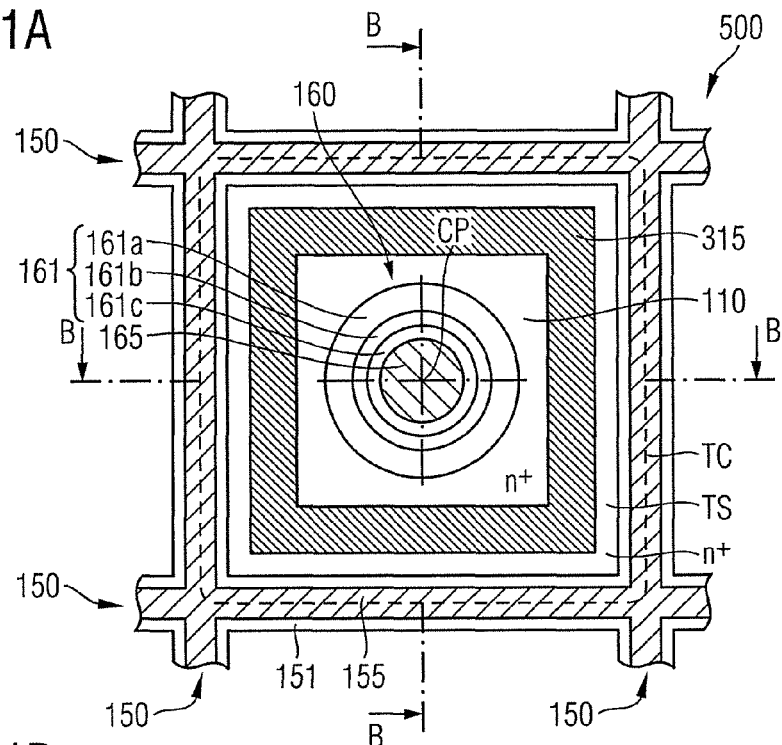
FIG. 1A is a schematic horizontal cross-sectional view of a portion of a semiconductor device according to an embodiment related to a field dielectric structure including an oxygen-containing layer.
Figure 1B:
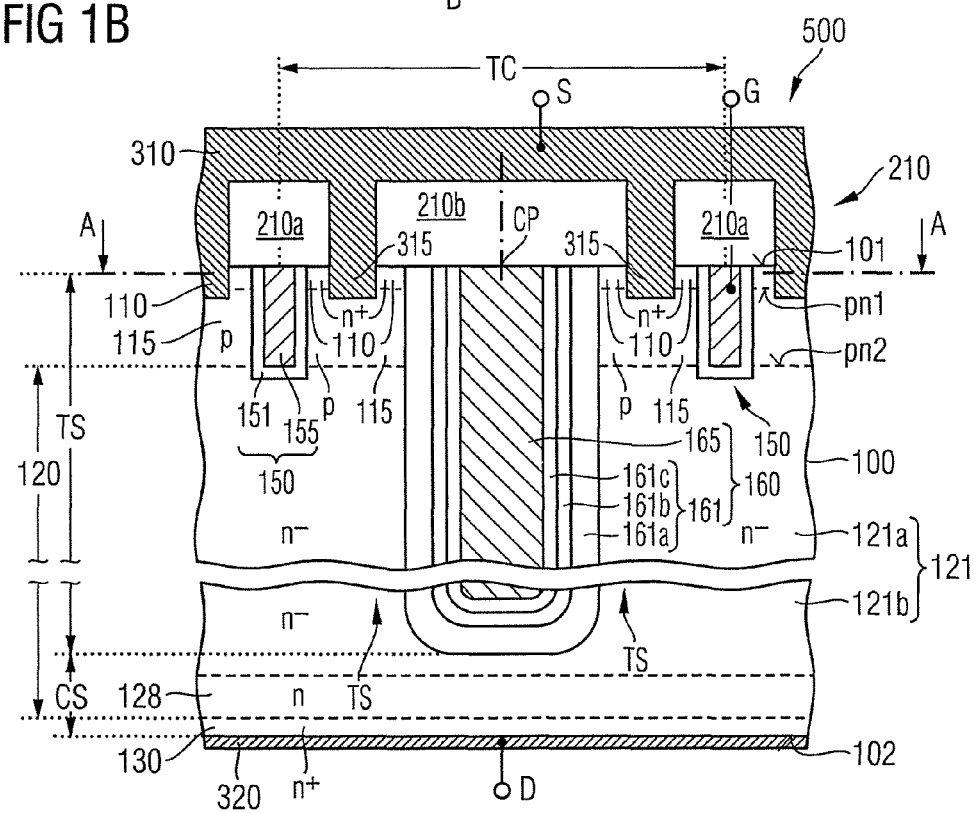
FIG. 1B is a schematic vertical cross-sectional view of the semiconductor device portion of FIG. 1A along line B-B.
Figure 1C:
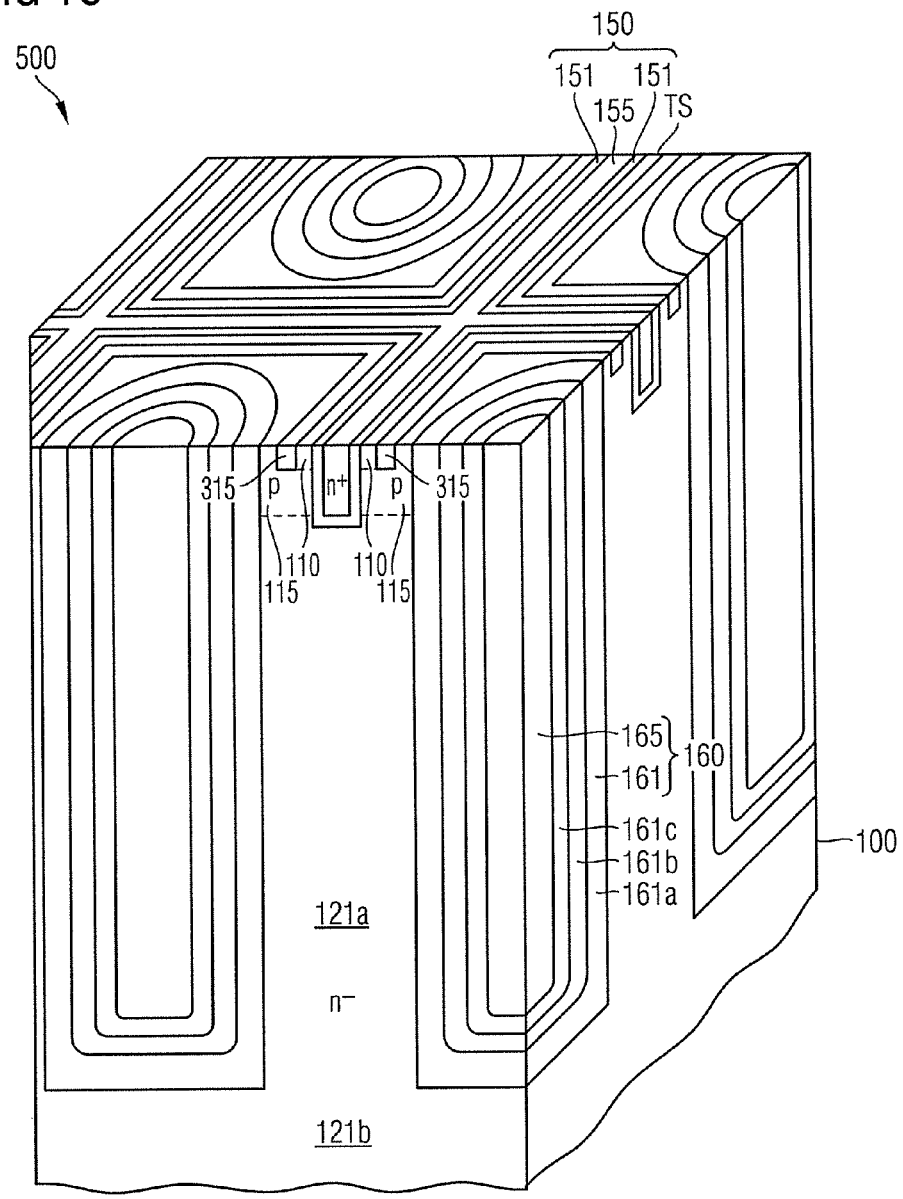
FIG. 1C is a schematic perspective view of the semiconductor device portion of FIG. 1A.

FIGS. 1A to 1C refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT.

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections as well as a planar second surface 102 parallel to the first surface 101. A distance between the first and second surfaces 101, 102 is selected to achieve a specified voltage blocking capability and may be at least 30 µm. According to other embodiments, the distance may be in the range of several hundred µm. A lateral surface, which is tilted to the first and second surfaces 101, 102 connects the first and second surfaces 101, 102.

In a plane perpendicular to the cross-sectional plane the semiconductor body 100 may have a rectangular shape with an edge length of several millimeters or may be disc-shaped with a diameter of several centimeters. A normal to the first surface 101 defines a vertical direction and directions orthogonal to the vertical direction are horizontal directions.

The semiconductor body 100 includes a drain structure 120 of a first conductivity type as well as a contact layer 130 of the first conductivity type between the drain structure 120 and the second surface 102. The drain structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between 5E12 cm$^{-3}$ and 5E17 cm$^{-3}$, for example in a range from 5E13 cm$^{-3}$ to 5E16 cm$^{-3}$. The drain structure 120 may include further doped zones, for example a field stop layer 128 that separates the drift zone 121 from the contact layer 130. A mean dopant concentration in the field stop layer 128 may be at least five times as high as a mean impurity concentration in the drift zone 121 and at most one-fifth of a maximum dopant concentration in the contact layer 130.

Along the second surface 102 a dopant concentration in the contact layer 130 is sufficiently high to form an ohmic contact with a metal directly adjoining the second surface 102. In case the semiconductor body 100 is based on silicon, in an n-conductive contact layer 130 the dopant concentration along the second surface 102 may be at least 1E18 cm$^{-3}$, for example at least 5E19 cm$^{-3}$. In a p-conductive contact layer 130, the dopant concentration may be at least 1E16 cm$^{-3}$, for example at least 5E17 cm$^{-3}$.

A field electrode structure 160 including a conductive spicular or needle-shaped field electrode 165 and a field dielectric 161 surrounding the field electrode 165 extends from the first surface 101 into the semiconductor body 100. The field electrode 165 includes or consists of a heavily doped polycrystalline silicon layer and/or a metal-containing layer. The field dielectric 161 separates the field electrode 165 from the surrounding semiconductor material of the semiconductor body 100.

A vertical extension of the field electrode structure 160 may be smaller than a distance between the first surface 101 and the field stop layer 128 such that a contiguous drift zone section 121b is formed between the field electrode structures 160 and the field stop layer 128. The vertical extension of the field electrode structure 160 may be in a range from 0.5 µm to 200 µm, for example in a range from 1 µm to 50 µm.

A first horizontal extension of the field electrode 165 may be at most three times or at most twice as large as a second horizontal extension orthogonal to the first horizontal extension. The horizontal extensions may be in a range from 0.1 µm to 20 µm, for example in a range from 0.2 µm to 5 µm.

The cross-sectional areas of the field electrodes 165 and the field electrode structures 160 may be rectangles, rectangles with rounded corners, regular polygons, or distorted polygons, with or without rounded corners, respectively. According to an embodiment, the first and second horizontal extensions are approximately equal and the cross-sectional areas of the field electrodes 165 and the field electrode structures 160 are regular polygons such as hexagons or squares, with or without rounded or beveled corners, respectively.

According to other embodiments, the cross-sectional areas of the field electrodes 165 and the field electrode structures 160 may be ellipses or ovals. According to an embodiment, the first and second horizontal extensions are approximately equal and the horizontal cross-sectional areas of the field electrodes 165 and the field electrode structures 160 are circles, wherein a portion of the total cross-sectional area that is assigned to the field electrode structure 160 can be reduced.

The transistor cells TC are centered on a horizontal center point CP of the field electrode structures 160. The transistor cells TC may be arranged matrix-like in lines and rows. According to other embodiments, the transistor cells TC may be arranged in lines, wherein the odd lines are shifted with respect to the even lines by half the distance between two transistor cells TC along the line. Semiconducting portions of the transistor cells TC are formed in transistor sections TS of the semiconductor body 100, wherein the transistor sections TS surround the respective field electrode structure 160. The transistor sections TS protrude from a contiguous section CS of the semiconductor body 100.

Each transistor section TS includes a body zone 115 of the second conductivity type, a first drift zone section 121a of the first conductivity type as well as one or more source zones 110 of the first conductivity type.

The first drift zone sections 121a formed between the field electrode structures 160 are directly connected to the contiguous drift zone section 121b formed in the contiguous semiconductor section CS of the semiconductor body 100. In each transistor section TS, the respective body zone 115 forms one or more first pn junctions pn1 with the one or more source zones 110 and a second pn junction pn2 with the first drift zone section 121a.

The source zones 110 may be wells extending from the first surface 101 into the semiconductor body 100, for example into the body zones 115. The body zone 115 of a transistor cell TC completely surrounds the respective field electrode structure 160 in a horizontal plane. According to an embodiment, one source zone 110 surrounds the field electrode structure 160 in a horizontal plane. The source zone(s) 110 may directly adjoin the field electrode structure 160 or may be spaced from the field electrode structure 160. According to other embodiments, the field electrode structure 160 of the transistor cell TC is not completely surrounded by one source zone 110 or includes several spatially separated source zones 110.

An outer contour line of a horizontal cross-sectional area of the transistor section TS may be a circle, an ellipse, an oval or a polygon, i.e. a hexagon or a square with or without rounded corners, respectively. An inner contour line of the transistor section TS is defined by the contour of the field electrode structure 160 in the horizontal plane. A horizontal width of the transistor section TS may be in a range from 0.02 µm to 2 µm, for example in a range from 0.1 µm to 0.5 µm.

A gate structure 150 includes a conductive gate electrode 155 surrounding the field electrode structure 160 in the horizontal plane within or outside the transistor section TS. According to the illustrated embodiment, the gate structure 150 surrounds the transistor section TS, which in turn surrounds the field electrode structure 160. The gate electrode 155 includes or consists of a heavily doped polycrystalline silicon layer and/or a metal-containing layer.

The gate electrode 155 is completely insulated against the semiconductor body 100, wherein a gate dielectric 151 separates the gate electrode 155 at least from the body zone 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate structure 150 may be a lateral gate formed outside the semiconductor body 100 along the first surface 101. According to the illustrated embodiment the gate structure 150 is a trench gate extending from the first surface 101 into the semiconductor body 100.

In the illustrated embodiments and for the following description, the first conductivity type is n-type and the second conductivity type is p-type. Similar considerations as outlined below apply also to embodiments with the first conductivity being p-type and the second conductivity type being n-type.

When a voltage applied to the gate electrode 150 exceeds a preset threshold voltage, electrons accumulate in the channel portions of the body zones 115 directly adjoining the gate dielectric 151 and form inversion channels short-circuiting the second pn junctions pn2 for electrons.

A vertical extension of the gate structures 150 is smaller than the vertical extension of the field electrode structure 160. The vertical extension of the gate structures 150 may be in a range from 200 nm to 5000 nm, for example in a range from 300 nm to 700 nm.

According to the illustrated embodiment the gate structure 150 surrounds the transistor section TS, such that the field electrode structure 160 and the gate structure 150 sandwich the interjacent transistor section TS with the source and body zones 110, 115. According to other embodiments, the gate structure 150 may be formed between the transistor section TS and the field electrode structure 160.

An interlayer dielectric 210 on the first surface 101 may include first dielectric portions 210a electrically insulating the gate electrodes 155 from a first load electrode 310 provided on the front side as well as second dielectric portions 210b insulating the field electrodes 165 from the first load electrode 310.

The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to a first load terminal, for example the source terminal S in case the semiconductor device 500 is an n-channel IGFET. A second load electrode 320, which directly adjoins the second surface 102 and the contact layer 130, may form or may be electrically connected to a second load terminal, which may be the drain terminal D in case the semiconductor device 500 is an n-IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, Al, and Pd as main constituent(s), e.g., a silicide, a nitride and/or an alloy.

Contact structures 315 extend through openings in the interlayer dielectric 210 and electrically connect the first load electrode 310 with the source and body zones 110, 115 of the transistor cells TC. The contact structures 315 may include one or more conductive metal containing layers based on, e.g., titanium (Ti) or tantalum (Ta) and a metal fill portion, e.g., based on tungsten (W). According to other embodiments the contacts structures 315 include heavily doped semiconductor structures, e.g., heavily p-doped columnar structures.

The field dielectric 161 includes a first dielectric layer 161a directly adjoining the surrounding semiconductor material of the semiconductor body 100 and a second dielectric layer 161b directly adjoining the first dielectric layer 161a such that the first dielectric layer 161a is sandwiched between the semiconductor body 100 and the second dielectric layer 161b. A band gap of the second dielectric layer 161b is smaller than a band gap of the first dielectric layer 161a. Alternatively or in addition a conduction band edge of the second dielectric layer 161b is lower than a conduction band edge of the first dielectric layer 161a.

The first dielectric layer 161a may be a semiconductor oxide, for example silicon oxide grown on the semiconductor material of the semiconductor body 100. According to other embodiments, the first dielectric layer 161a includes or consists of a deposited silicon oxide, e.g. silicon oxide formed on the basis of TEOS (tetraethyl orthosilicate). The first dielectric layer 161a may be a highly conformal layer with almost uniform layer thickness. A thickness of the first dielectric layer 161a is in a range from 20 nm to 5 µm, for example in a range from 50 nm to 700 nm.

The second dielectric layer 161b may be a layer containing a semiconductor and nitrogen, for example $Si_3N_4$. The second dielectric layer 161b may also contain hydrogen and/or oxygen. For example, the second dielectric layer 161b may be a $SiO_xN_y$ layer with x<y. The second dielectric layer 161b may be deposited in an LPCVD (low pressure chemical vapor deposition) or a PECVD (plasma enhanced chemical vapor deposition) or ALD (atomic layer deposition) process. According to an embodiment the second dielectric layer 161b is a silicon (oxy) nitride layer thermally grown on the first dielectric layer 161a. The second dielectric layer 161b may be a highly conformal layer with almost uniform thickness of at most 30 nm, for example at most 10 nm.

The field dielectric 161 may include further layers, for example layers with a greater band gap and/or higher conduction band edge than the second dielectric layer 161b, e.g., semiconductor oxide or semiconductor oxynitride layers. The second dielectric layer 161b may extend along the whole vertical extension of the field electrode structure 160. According to an embodiment, the second dielectric layer 161b is exclusively formed in a portion of the field electrode structure 160 oriented to the second surface 102. For example, the second dielectric layer 161b is formed along the end portion or buried tip of the field electrode structure 160. The field electrode structures 160 allow higher dopant concentrations in the drift zone 121 without adversely affecting the blocking capability of the semiconductor device 500. The needle-shaped field electrodes 165 increase the available cross-sectional area for the drift zone 121 and therefore reduce the on-state resistance RDSon compared to stripe-shaped field electrodes. A higher curvature of the needle-shaped field electrodes increases the electric field strength in the field dielectric 161. The increased field strength in combination with defects in the field dielectric 161 may reduce the operational lifetime of the semiconductor device 500 and device reliability. The second dielectric layer 161b compensates to some degree for defects in the first dielectric layer 161a. As a result, the semiconductor device 500 is less prone to reliability issues concerning the field dielectric 161.

FIGS. 2A to 2C refer to a method of manufacturing a semiconductor device 500 as shown in FIGS. 1A to 1C and illustrate effects of the embodiments.

First trenches 191 are etched into a main surface 101a of a semiconductor substrate 500a provided from a single-crystalline semiconductor material, for example silicon. A first horizontal extension of the first trenches 191 parallel to the main surface 101a is at most twice as large as a second horizontal extension orthogonal to the first horizontal extension. A first dielectric layer 161a, for example a field oxide layer, may be formed by a deposition process that may use TEOS as precursor material or by thermal oxidation at about 1100° C. in an oxygen containing ambient, or by a combination of both.

FIG. 2A shows the resulting first dielectric layer 161a formed on the exposed surface of a semiconductor layer 100a and lining the first trenches 191. The thickness of the first dielectric layer 161a is in a range from 20 nm to 5 µm, for example from 50 nm to 700 nm. Due to process inhomogeneities, the first dielectric layer 161a may have defects 161x, e.g. spikes, where the thickness of the first dielectric layer 161a is reduced.

A conformal second dielectric layer 161b, e.g., a field nitride layer, is formed, e.g., by deposition such as LPCVD and/or PECVD.

FIG. 2B shows the second dielectric layer 161b covering the first dielectric layer 161a. The second dielectric layer 161b may have a thickness of at most 30 nm, for example at most 10 nm. Since the first dielectric layer 161a and the second dielectric layer 161b result from different processes, defects 161x in the respective layer occur at different locations such that the second dielectric layer 161b significantly increases the reliability of the field dielectric 161. The second dielectric layer 161b may be recessed locally.

According to an embodiment, a third dielectric layer 161c, e.g., an oxygen-containing layer, may be formed on the second dielectric layer 161b. A band gap of the third dielectric layer 161c is greater than a band gap of the second dielectric layer 161b. Alternatively or in addition a conduction band edge of the third dielectric layer 161c is higher than a conduction band edge of the second dielectric layer 161b.

Then a material forming the field electrode 165 may be deposited. Gate electrodes 155 are formed in second trenches 192 lined by a gate dielectric layer 151x, wherein the gate dielectric layer 151x may be a portion of at least one of the layers of the field dielectric 161, e.g., the third dielectric layer 161c. The second trenches 192 may be separated from the first trenches 191 or may be portions of the first trenches 191.

FIG. 2C shows the third dielectric layer 161c, which smoothens thickness variations of the underlying first and second dielectric layers 161a, 161b. The thickness of the third dielectric layer 161c may be between 5 nm and 50 nm, by way of example. The third dielectric layer 161c may be a silicon oxide layer or $SiO_xN_y$ layer with x>y. The material of the field electrode 165 may be heavily doped polycrystalline silicon. Further embodiments may provide further dielectric layers or interface layers between the field dielectric 161 and the field electrode 165.

FIG. 3 shows an electronic band structure along a cross-section through the field dielectric in FIG. 2C. The second dielectric layer 161b sandwiched between the first dielectric layer 161a and the third dielectric layer 161c forms a quantum well for electrons. During operation of the semiconductor device, high electric field strength, for example around corners, at edges or locations of pronounced roughness may inject electrons into the field dielectric 161. The quantum well of the second dielectric layer 161b retains the injected electrons. The trapped electrons locally decrease the electric field maxima and inhibit further electron injection.

The description of the further embodiments omits the description of elements described in detail with respect to FIGS. 1A to 1C.

The semiconductor device 500 of FIGS. 4A to 4B differs from the embodiment of FIGS. 1A to 1C in that the third dielectric layer is absent and in that the second dielectric layer 161b directly adjoins the conductive field electrode 165.

Figure 5A:
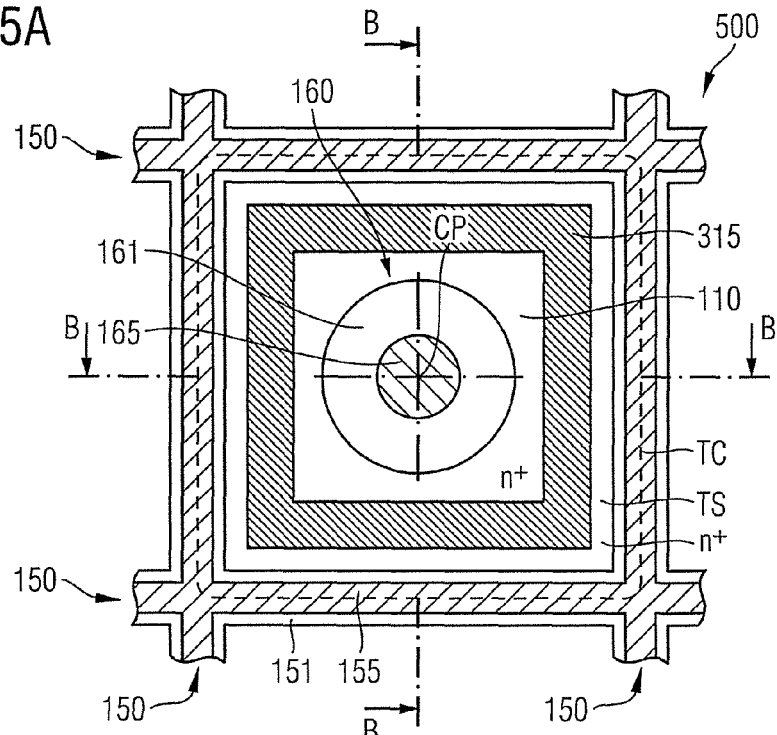
FIG. 5A is a schematic horizontal cross-sectional view of a portion of a semiconductor device according to an embodiment related to a field dielectric with a second dielectric layer formed only at a buried tip of the field electrode structure.
Figure 5B:
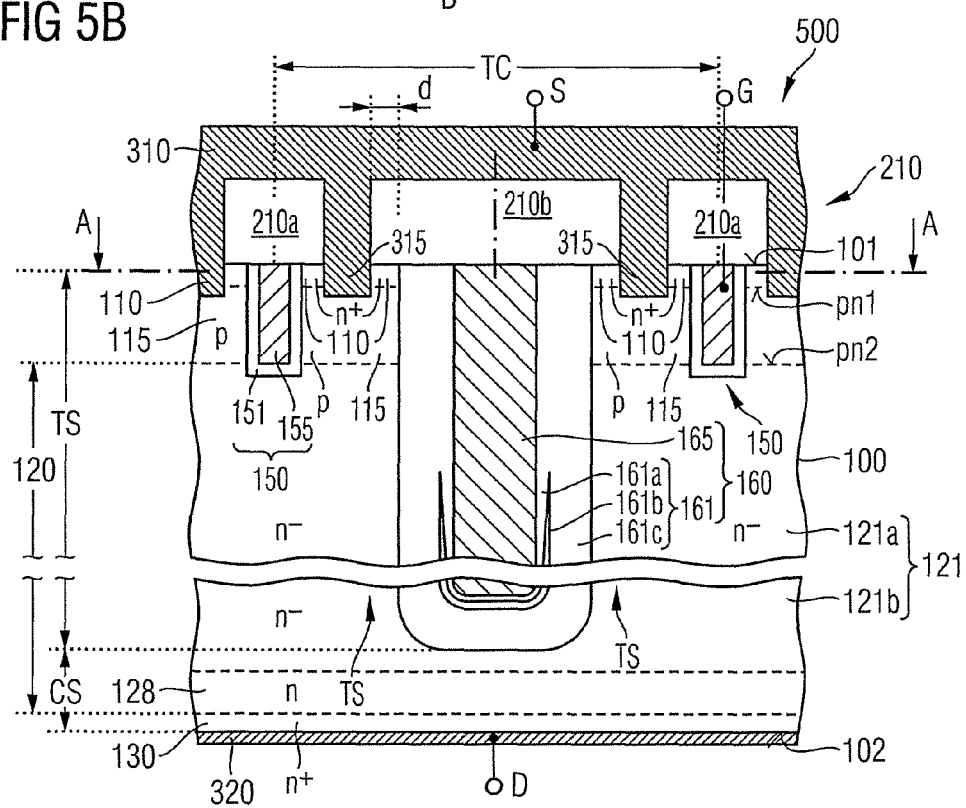
FIG. 5B is a schematic vertical cross-sectional view of the semiconductor device portion of FIG. 5A.

The field dielectric 161 of the semiconductor device 500 of FIGS. 5A to 5B includes a second dielectric layer 161b that is formed only in a portion of the vertical extension of the field electrode structure 160. The second dielectric layer 161b is exclusively formed in a portion of the field dielectric 161 oriented to the second surface 102 at the buried tip of the field electrode structure 160. For example, the second dielectric layer 161b is formed only at most in the lower half or at most in the lower third of the vertical extension of the field electrode structure 160 with respect to the first surface 101. The second dielectric layer 161b may be cup-shaped and encloses the lower portion of the field electrode 165 in all horizontal directions and with respect to portions of the semiconductor body 100 between the field electrode structure 160 and the second surface 102.

The electric field strength increases with increasing curvature of the field dielectric 161 such that electric field strength maxima occur in a bottom region of the field electrode structures 160 at the buried tips of the needle-shaped field electrode structures 160, where the field strength is about 2.5 times as high as along straight sidewall portions of the field dielectric 161. The recessed second dielectric layer 161b locally enhances the field dielectric 161 in regions where such defects are more critical.

In the semiconductor device 500 of FIGS. 6A to 6D, the gate structures 150 are formed between the field electrode structures 160 and the transistor sections TS, respectively. Each gate structure 150 may be formed based on the same trench as provided for the concerned field electrode structure 160, such that an outer contour of the gate structure 150 is formed in the vertical projection of a bottom portion of the field dielectric 161, wherein the bottom portion is that portion that is oriented to the rear side. The outer contour of the gate structure 150 may be flush with the outer contour of the bottom portion of the field electrode structure 160.

According to other embodiments, the gate structure 150 may be formed outside a trench on which the adjacent field electrode structure 160 is based. A portion 161z of the field dielectric 161 separates the field and gate electrodes 165, 155. An ancillary contact structure 315b concentric with the transistor cell TC may electrically connect the field electrode 165 with the first load electrode 310. According to other embodiments the interlayer dielectric 210 insulates the first load electrode 310 from the field electrode 165.

Figure 6A:
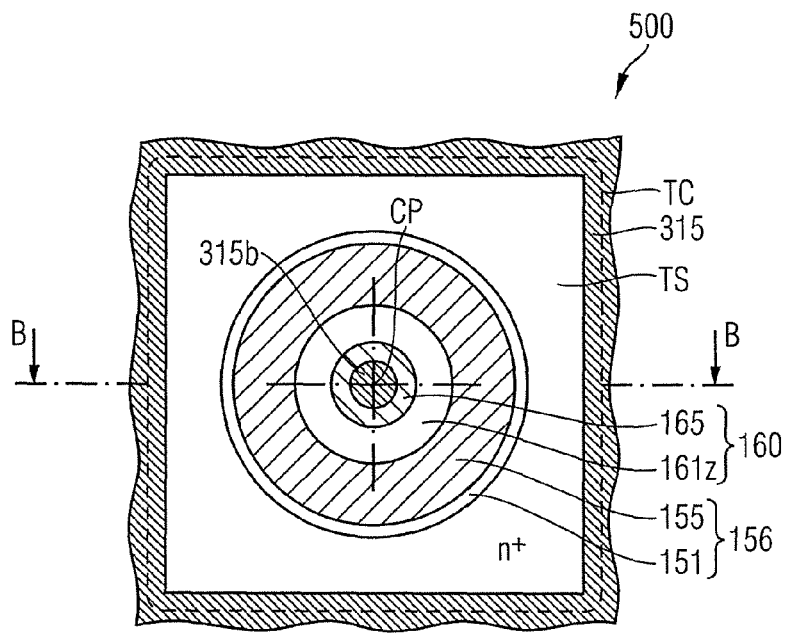
FIG. 6A is a schematic horizontal cross-sectional view of a portion of a semiconductor device according to an embodiment related to ring-shaped gate electrodes formed between the field electrode and the transistor section of the respective transistor cell.
Figure 6B:
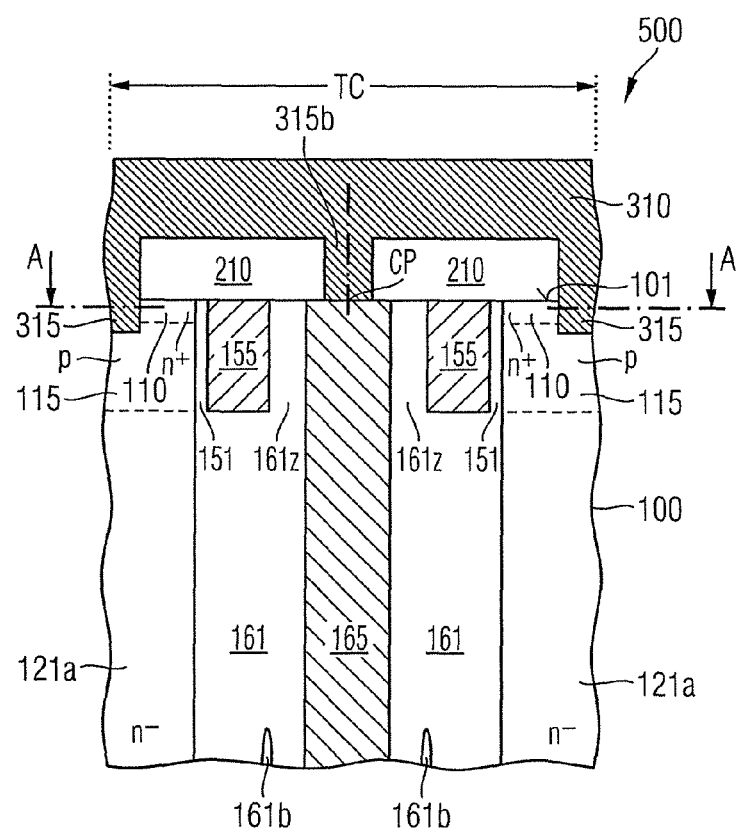
FIG. 6B is a schematic vertical cross-sectional view of the semiconductor device portion of FIG. 6A along line B-B.
Figure 6C:
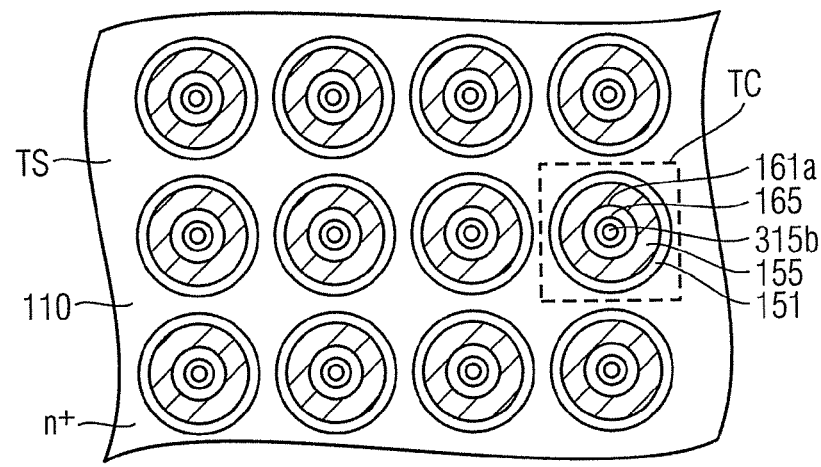
FIG. 6C is a schematic layout of transistor cells as illustrated in FIGS. 6A to 6B according to an embodiment with the transistor cells arranged in a matrix.

The transistor cells TC may be arranged matrix-like in equally spaced parallel lines and rows as illustrated in FIG. 6C.

Figure 6D:
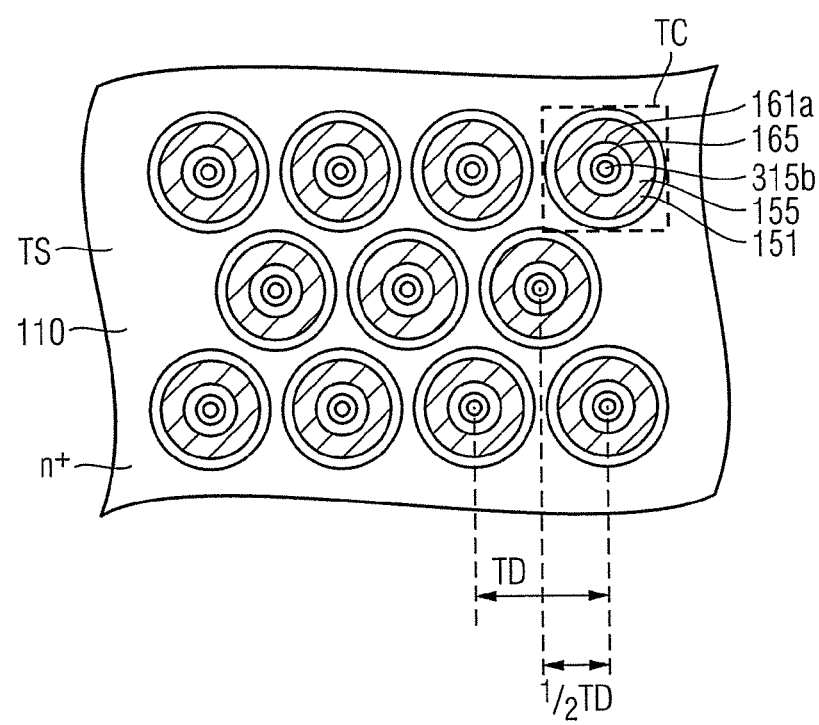
FIG. 6D is a schematic layout of transistor cells as illustrated in FIGS. 6A to 6B according to an embodiment with the transistor cells arranged in staggered lines.

In FIG. 6D the transistor cells TC in odd lines are shifted with respect to that in even lines along the line direction by the half TD/2 center-to-center distance TD between neighboring transistor cells TC along the line.

Figure 7:
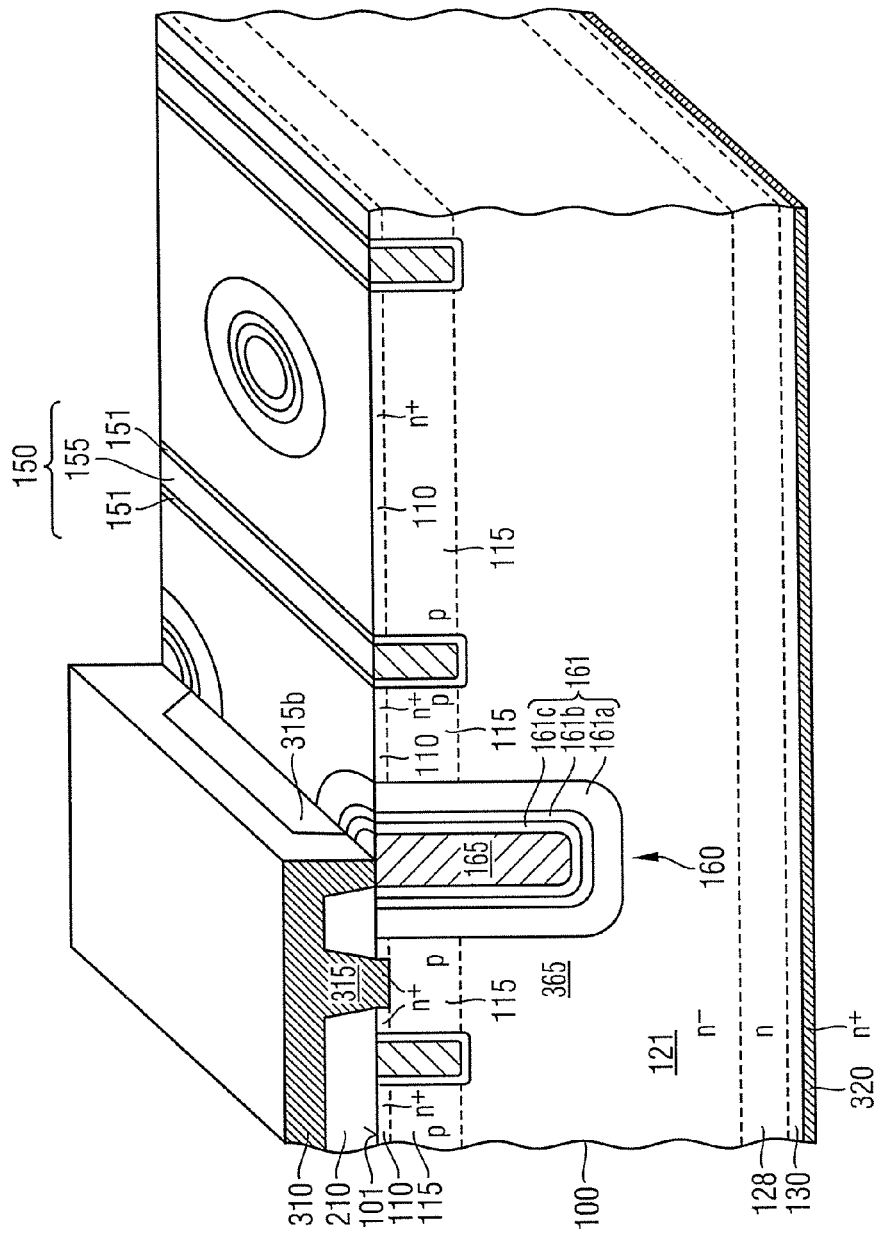
FIG. 7 is a schematic perspective view of a portion of a semiconductor device according to an embodiment related to stripe-shaped gate structures and spatially separated needle-shaped field electrodes.

The semiconductor device 500 of FIG. 7 combines needle-shaped field electrodes 165 with stripe-shaped gate structures 155.

Compared to stripe-shaped field electrodes, the spicular or needle-shaped field electrodes 165 of the present embodiments increase the total area of the transistor sections TS in a given semiconductor area and therefore reduce the total on-state resistance of the drift zone 121 and the device RDSon. The multi-layer field dielectric 161 according to the embodiment increase device reliability.

Figure 8:
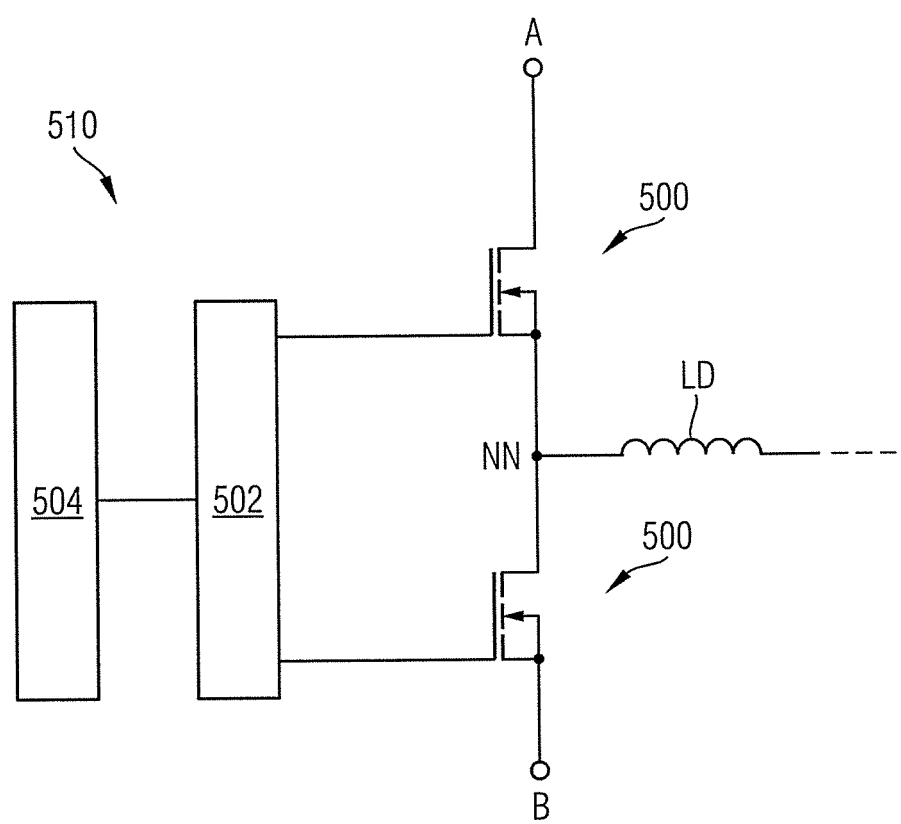
FIG. 8 is a schematic circuit diagram of an electronic assembly according to an embodiment related to switched mode power supplies and motor drives.

FIG. 8 refers to an electronic assembly 510 that may be a motor drive, a switched mode power supply, a primary stage of a switched mode power supply, a synchronous rectifier, or a solar power converter, by way of example.

The electronic assembly 510 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly may further include a control circuit 504 configured to alternately switch on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

According to another embodiment, the electronic assembly 510 may be a primary side stage of a switched mode power supply with the supply terminals A, B supplying an AC voltage to the electronic circuit 510 and the network node NN electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 510 may be a primary side stage of a DC-to-DC converter, e.g., a power optimizer or a micro inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC converter, e.g., a power optimizer or a micro inverter for applications including photovoltaic cells, wherein the electronic circuit 510 supplies an output voltage to the supply terminals A, B and wherein the network node NN is electrically connected to the inductive storage element.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device, comprising:
a field electrode structure comprising a field electrode and a field dielectric, wherein the field dielectric is positioned between the field electrode and a drift zone section, and wherein the field dielectric comprises a first dielectric layer and a second dielectric layer having at least one of a smaller band gap and a lower conduction band edge than the first dielectric layer; and
a semiconductor body comprising a transistor section surrounding the field electrode structure, directly adjoining the first dielectric layer, and comprising a source zone, the drift zone section and a body zone separating the source zone and the drift zone section, the body zone forming a first pn junction with the source zone and a second pn junction with the drift zone section;
wherein the field dielectric further comprises a third dielectric layer, and wherein the second dielectric layer is sandwiched between the first dielectric layer and the third dielectric layer;
a gate structure comprising a gate electrode and a gate dielectric separating the gate electrode and the body zone, wherein the gate structure surrounds the field electrode structure;
wherein the transistor section is sandwiched between the field electrode structure and the gate structure in a horizontal plane parallel to a first surface of the semiconductor body.

2. The semiconductor device of claim 1, wherein the first dielectric layer is an oxide layer.

3. The semiconductor device of claim 1, wherein the second dielectric layer is a silicon nitride layer.

4. The semiconductor device of claim 1, wherein the gate electrodes of a plurality of transistor cells form a grid embedding the transistor sections of the transistor cells.

5. The semiconductor device of claim 1, wherein the gate electrode is formed between the field electrode and the transistor section in a horizontal plane parallel to a first surface of the semiconductor body.

6. The semiconductor device of claim 5, wherein the transistor sections of a plurality of transistor cells form a grid embedding the gate structures and field electrode structures of the transistor cells.

7. The semiconductor device of claim 1, wherein the field electrode extends in a vertical direction perpendicular to a horizontal plane parallel to a first surface of the semiconductor body.

8. The semiconductor device of claim 1, wherein the field electrode comprises a first horizontal extension and a second horizontal extension orthogonal to the first horizontal extension.

9. The semiconductor device of claim 1, wherein a horizontal cross-sectional area of the field electrode is a circle or a square with rounded corners or a regular hexagon with rounded corners.

10. The semiconductor device of claim 1, wherein the first dielectric layer separates the second dielectric layer from the transistor section.

11. The semiconductor device of claim 1, wherein the third dielectric layer is an oxygen-containing layer.

12. The semiconductor device of claim 1, wherein the third dielectric layer is a deposited silicon oxide layer with a thickness in a range from 10 nm to 30 nm.

13. The semiconductor device of claim 1, wherein a thickness of the second dielectric layer is in a range from 10 nm to 30 nm.

14. The semiconductor device of claim 1, wherein the first dielectric layer is a thermally grown silicon oxide layer.

15. A semiconductor device, comprising:
a field electrode structure comprising a field electrode and a field dielectric, wherein the field dielectric is positioned between the field electrode and a drift zone section, and wherein the field dielectric comprises a first dielectric layer and a second dielectric layer having at least one of a smaller band gap and a lower conduction band edge than the first dielectric layer; and
a semiconductor body comprising a transistor section surrounding the field electrode structure, directly adjoining the first dielectric layer, and comprising a source zone, the drift zone section and a body zone separating the source zone and the drift zone section, the body zone forming a first pn junction with the source zone and a second pn junction with the drift zone section;
wherein the field dielectric further comprises a third dielectric layer, and wherein the second dielectric layer is sandwiched between the first dielectric layer and the third dielectric layer;
wherein the second dielectric layer is formed at most in the lower third of the vertical extension of the field electrode structure.

16. A semiconductor device, comprising:
a field electrode structure comprising a field electrode and a field dielectric surrounding the field electrode, wherein the field dielectric comprises a first dielectric layer and a second dielectric layer having at least one of a smaller band gap and a lower conduction band edge than the first dielectric layer;
a semiconductor body comprising a transistor section surrounding the field electrode structure, directly adjoining the first dielectric layer, and comprising a source zone, a drift zone section and a body zone separating the source zone and the drift zone section, the body zone forming a first pn junction with the source zone and a second pn junction with the drift zone section; and
a gate electrode formed between the field electrode and the transistor section, wherein a top edge of the gate electrode and a top edge of the field electrode are in a horizontal plane parallel to a first surface of the semiconductor body.

* * * * *